US012777942B2

United States Patent
(12) United States Patent
Arora et al.

(10) Patent No.: US 12,777,942 B2
(45) Date of Patent: Oct. 27, 2026

(54) CHIP PACKAGE WITH TAMPER PREVENTION

(71) Applicant: Advanced Micro Devices, Inc., Santa Clara, CA (US)

(72) Inventors: Mohit Arora, Austin, TX (US); Deepak Vasant Kulkarni, Austin, TX (US); Richard E. George, Santa Clara, CA (US); Terry Eugene Richardson, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 353 days.

(21) Appl. No.: 18/382,973

(22) Filed: Oct. 23, 2023

(65) Prior Publication Data

US 2025/0132270 A1 Apr. 24, 2025

(51) Int. Cl.
*H01L 23/00* (2006.01)
*H01L 25/00* (2006.01)
*H01L 25/065* (2023.01)

(52) U.S. Cl.
CPC .......... *H01L 23/576* (2013.01); *H01L 23/573* (2013.01); *H01L 25/0655* (2013.01); *H01L 25/50* (2013.01)

(58) Field of Classification Search
CPC . H01L 23/576; H01L 23/573; H01L 25/0655; H01L 25/50
See application file for complete search history.

(56) References Cited

U.S. PATENT DOCUMENTS 8,689,357 B2 4/2014 Arora et al.
2014/0159040 A1* 6/2014 Dimitrakopoulos ......................... H01L 23/53276 257/48
2014/0162464 A1* 6/2014 Dimitrakopoulos ......................... H01L 21/02225 438/761
2014/0353849 A1 12/2014 Arora et al.
2022/0352099 A1* 11/2022 Albright ................. G06F 21/86
2023/0187371 A1* 6/2023 Parker ................... H04L 9/0869 438/401
2025/0038132 A1* 1/2025 La Tulipe ......... H01L 23/49822
2025/0117472 A1* 4/2025 Chen ....................... G06F 21/54

FOREIGN PATENT DOCUMENTS

EP 0834918 A1 4/1998

* cited by examiner

*Primary Examiner* — J. E. Schoenholtz
(74) *Attorney, Agent, or Firm* — Patterson + Sheridan, LLP

(57) ABSTRACT

A chip package includes a package substrate and an integrated circuit (IC) die disposed on the package substrate. The IC dies includes a security asset. The chip package also includes a glass based shield selectively disposed on the IC die and above the security asset. The glass based shield is configured to block access to the security asset. In some embodiments, the chip package includes an oxide layer disposed between the glass based shield and the IC die. In some embodiments, the chip package includes a detection module and a wire connecting the detection module to the glass based shield. The detection module is configured to generate and send a serial bit stream to the glass based shield. The detection module is also configured to monitor for changes in the serial bit stream returning from the glass based shield. Changes detected in the serial bit stream indicates the glass based shield has been tampered.

20 Claims, 8 Drawing Sheets

CHIP PACKAGE WITH TAMPER PREVENTION

TECHNICAL FIELD

Embodiments of the present invention generally relate to a chip package, and in particular, to chip package having a selective glass shield to prevent tamper.

BACKGROUND

Integrated circuits (ICs) often include sensitive information that may be interesting to hackers. A known technique used by hackers to gain access to information residing in an IC is micro-probing. Micro-probing involves forming an electrical contact with the IC by dropping a probe needle directly on the point of interest of the IC, or on an area of the IC to which the point of interest is connected. The probe needles are held by a micro-manipulator that is controlled by the hacker to precisely land the probe needle on the IC. The needle injects a voltage pulse that couples with the chip structure. Fault injection is another technique used to conduct a physical attach against integrated circuits. For example, fault injection may use electromagnetic pulses to inject errors into the integrated circuit to gain access or to bypass security features.

Probing the backside of a die has been used to attack ICs. This may occur with a flip chip package because the back side of the die is completely exposed. Often, all that is required is removal of the heat sink mounted on the flip chip package. The exposed back side of the die thus allows voltage to be injected into the power structure of the chip package by applying bias to the bulk silicon. Another potential point of attack is the interconnect between dies for a multi-die package because the interconnect location is fully known.

There is a need, therefore, for a chip package having a selective silicon glass shield and/or a detection module for preventing tampering.

SUMMARY

In some embodiments, a chip package includes a package substrate and an integrated circuit (IC) die disposed on the package substrate. The IC dies includes a security asset. The chip package also includes a glass based shield selectively disposed on the IC die and above the security asset. The glass based shield is configured to block access to the security asset.

In some embodiments, the chip package includes an oxide layer disposed between the glass based shield and the IC die.

In some embodiments, the chip package includes a detection module and a wire connecting the detection module to the glass based shield. The detection module is configured to generate and send a serial bit stream to the glass based shield. The detection module is also configured to monitor for changes in the serial bit stream returning from the glass based shield. Changes detected in the serial bit stream indicates the glass based shield has been tampered.

In another example, a chip package includes a package substrate and an integrated circuit (IC) die disposed on the package substrate. A security asset is disposed in the IC die and includes a detection module for generating a serial bit stream. A glass based shield is selectively disposed on the IC die and above the security asset. The glass based shield prevents access to the security asset. The chip package also includes a wire for transmitting the serial bit stream to the glass based shield and a comparator for determining a change in the serial bit stream.

In another example, a method of preventing tampering of a chip package includes disposing a glass based shield on an integrated circuit ("IC") die of the chip package. The chip package has a detection module and an active wire connected to the detection module. The method also includes coupling the active wire to the glass based shield. The active wire has a wire mesh disposed in the glass based shield. The method further includes sending an outgoing serial bit stream from the detection module to the wire mesh in the glass based shield. The detection module receives a return serial bit stream from the wire mesh. The outgoing serial bit stream is compared to the return serial bit stream. A tampering event is indicated if the return serial bit stream is different from the outgoing serial bit stream.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

In some embodiments, a chip package is provided with a glass based shield selectively disposed on an integrated circuit (IC) die at a location above a security asset in the IC die. The glass based shield advantageously prevents access to the security asset via the IC die. The chip package may optionally include an oxide layer disposed between the glass base shield and the IC die. The oxide layer acts as an insulator against electrical tampering of the IC die. In some embodiments, the chip package includes an active shield having a detection module and a wire connecting the detection module to the glass based shield. The detection module is configured to generate and send a serial bit stream to the glass based shield. The detection module is also configured to monitor for changes in the serial bit stream returning from the glass based shield. Changes detected in the serial bit stream indicates the glass based shield has been tampered.

Figure 1:
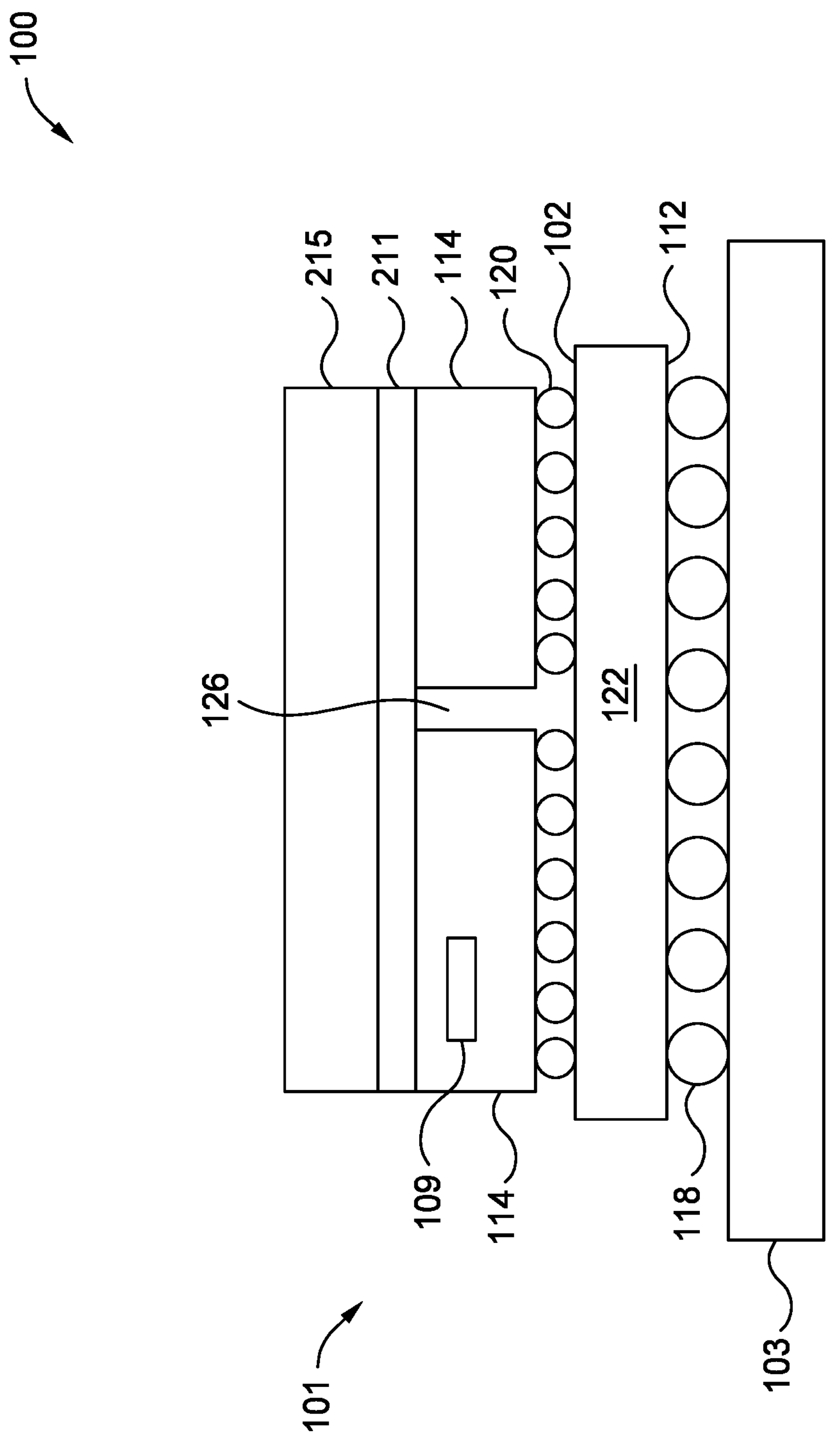
FIG. 1 is a front schematic view of an electronic device having an integrated chip package having an exemplary oxide layer as a passive shield, according to some embodiments.

Turning now to FIG. 1, an exemplary integrated chip package 101 is schematically illustrated as disposed on a printed circuit board (PCB) 103. A partial sectional view of the chip package 101 is shown in FIG. 1. The chip package 101 and the PCB 103 together form at least part of an electronic device 100. The electronic device 100 may be a tablet, computer, copier, digital camera, smart phone, control system, automated teller machine, server or other solid-state memory and/or logic device.

The chip package 101 includes at least two IC dies 114 mounted to a package substrate 122. Although two IC dies 114 are shown in the example depicted in FIG. 1, the number of IC dies 114 may range from one to as many as can be fit within the chip package 101.

The package substrate 122 includes circuitry for electrically connecting the IC dies 114 to circuitry of the package substrate 122. Solder connections 120, also known as or "micro bumps," are utilized to provide mechanical and electrical connections between the circuitry of the IC dies 114 and the circuitry of the package substrate 122. The solder connections 120, when in the form of solder joints, may be fabricated from tin-lead solder, lead-free solder, solder on copper pillar, or other suitable solder. In the example depicted in FIG. 1, solder connections 120 couple the bottom surface of the IC dies 114 to the top surface 102 of the package substrate 122. Underfill, not shown, may be utilized to fill the space not taken by the solder connections 120 between the IC dies 114 and the package substrate 122.

Solder connections 118, also known as or "solder balls," are utilized to provide mechanical and electrical connections between the circuitry of the PCB 103 and the circuitry of the package substrate 122. Alternatively, the package substrate 122 may be coupled to the PCB 103 by a Pin Grid Array (PGA) or other suitable technique. In the example depicted in FIG. 1, solder connections 118 couple the bottom surface 112 of the package substrate 122 to a top surface of the PCB 103.

As discuss above, the IC dies 114 is mounted to the top surface 102 the package substrate 122. The IC dies 114 may be programmable logic devices, such as field programmable gate arrays (FPGA), memory devices, optical devices, processors or other IC logic structures. Optical devices include photo-detectors, lasers, optical sources, and the like. Optionally, an interposer may be disposed between the IC dies 114 and the package substrate 122. In one embodiment, at least one of the dies 144 include a security asset such as Root of Trust and other sensitive information in the chip package 101.

In some embodiments, the chip package 101 includes a passive shield disposed on top of the dies 114. In one embodiment, the passive shield is an insulation layer. An exemplary insulation layer is an oxide layer 211. The oxide layer 211 may act as an electrical insulator to protect against external attacks.

In one example, the oxide layer 211 may be formed by attaching a carrier silicon 215 on the dies 114 using oxide fusion bonding. The thickness of the oxide layer 211 may be determined based on the protection required. A thicker oxide layer 211 may protect against a higher voltage. In some examples, the oxide layer 211 may be from 0.1 μm to 0.8 μm or from 1 μm to 0.5 μm. In addition to shielding the dies 144, the oxide layer 211 may extend across the gap 126 between the dies 114, thereby shielding the gap 126.

Figure 2:
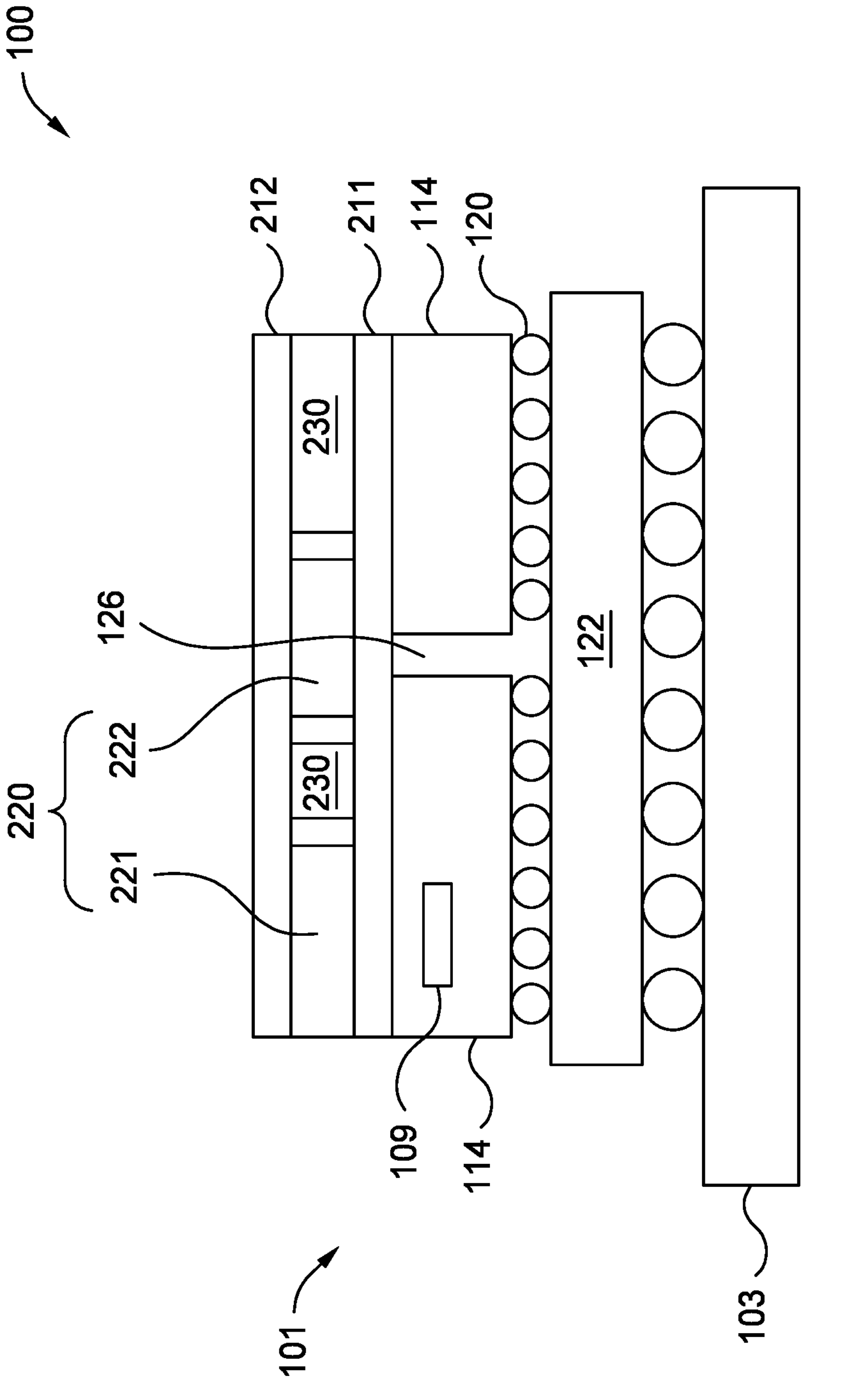
FIG. 2 is a front schematic view of an electronic device having an integrated chip package having an exemplary glass based shield selectively disposed on an IC die, according to some embodiments.

In another embodiment, the chip package 101 includes one or more glass based shields 220 as the passive shields, as shown in FIG. 2. In one example, the glass based shields 220 may be manufactured from borosilicate glass, quartz, or fused silica. The glass based shields 220 may be selectively disposed at locations where protection is desired. In FIG. 2, a first glass based shield 221 is disposed above the die 114 containing the security asset 109 to prevent backside attacks. The first glass based shield 221 is located above the security asset 109 and may have the same length as the security asset 109. In another example, the first glass based shield has a length that extends beyond the security asset 109 to provide more protection around the security asset 109. In some embodiments, the length of the first glass based shield 221 is smaller than the die 114 containing the security asset 109. As shown, the first glass based shield 221 is disposed above the oxide layer 211. However, it is contemplated inclusion of the oxide layer 211 below the glass based shield 222 is optional.

In some embodiments, a second glass based shield 222 is disposed above the gap 126 between two dies 114. In this example, the second glass based shield 222 at least partially overlaps both dies 114. The second glass based shield 222 blocks access to the gap 126, thereby preventing attacks on the interconnect wires between the dies 114. It is contemplated the second glass based shield 222 may be extend to protect interfaces between any suitable number of dies in a chip package. As shown, the second glass based shield 222 is disposed above the oxide layer 211. However, it is contemplated inclusion of the oxide layer 211 below the second glass based shield 222 is optional.

In some embodiments, one or more optional silicon carriers 230 may be disposed in the space between the glass based shields 221, 222 and on the dies 114. The silicon carriers 230 may help even out the contour above the dies 114. In some embodiment, a heat sink (not shown) may be disposed above the glass based shields 221, 222, with or without the silicon carriers 230.

In this example, an optional second oxide layer 212 is disposed above the glass based shields 221, 222 and the silicon carriers 230. In some embodiments, a heat sink (not shown) may be disposed above the second oxide layer 212. In another embodiment, a silicon carrier (not shown) is disposed above the second oxide layer 212.

Figure 3:
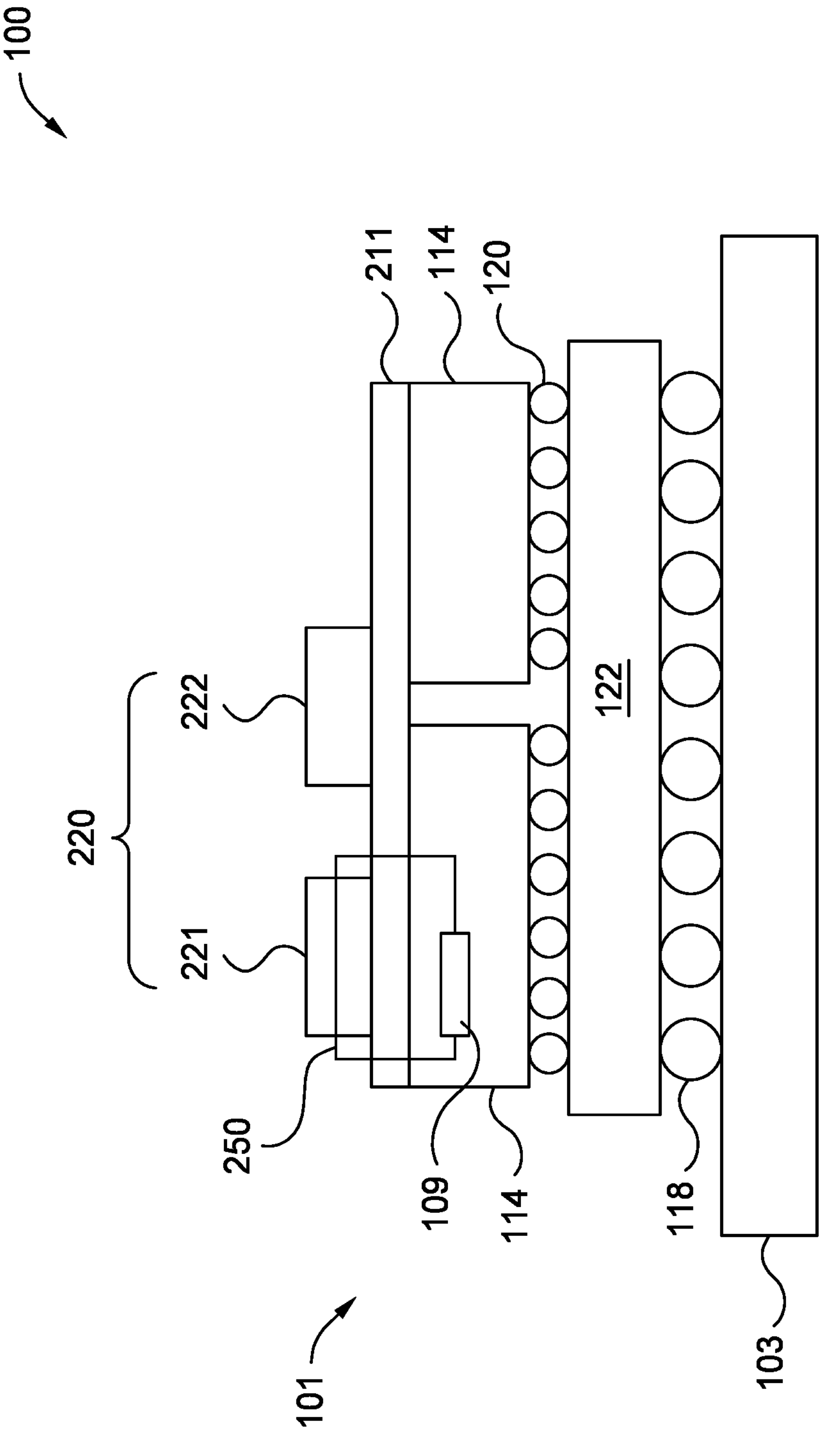
FIG. 3 is a front schematic view of an electronic device having an integrated chip package having an exemplary active shield connected to a glass based shield, according to some embodiments.

In another embodiment, the chip package 101 includes an active shield system 250 for monitoring tampering of the first glass based shield 221, as shown in FIG. 3. In this example, the active shield system 250 includes inverted wires disposed around the first glass based shield 221. The active shield system 250 can be controlled and monitored by the security asset 109. In one example, the security asset 109 includes a Root of Trust. A wire short is generated if the first glass based shield 221 is removed or damaged. The wire short can be detected by the security asset 109 to suggest tampering has occurred.

Figure 4:
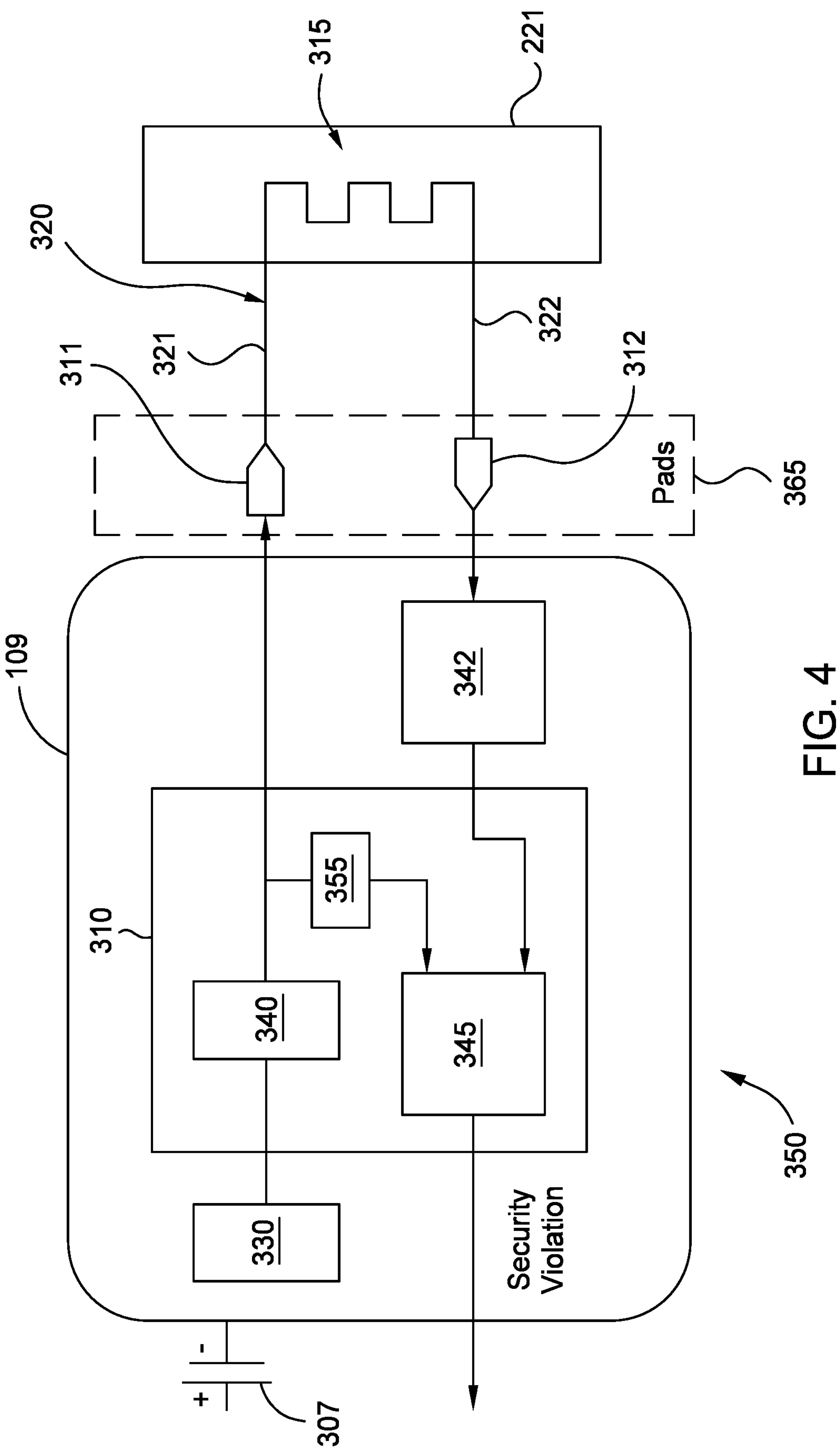
FIG. 4 illustrates an exemplary active shield for monitoring tampering of the glass based shield, according to some embodiments.

FIG. 4 illustrates an exemplary active shield system 350 suitable for detecting tampering of the glass based shield 221. The active shield system 350 may be used as the active shield system 250 of FIG. 3. In one embodiment, the active shield system 350 includes a detection module 310 and an active wire 320 connected to the detection module 310. The detection module 310 may be a component of the security asset 109.

In one embodiment, the active wire 320 includes a first wire portion 321 and a second wire portion 322, and a wire mesh 315. The first wire portion 321 is connected to the output terminal 311, and the second wire portion 322 is connected to the input terminal 312 of the detection module 310. In some embodiments, the input terminal 312 and the output terminal 311 are pads 365 in the IC die 114. The active wire 320 forms a wire mesh 315 inside the first glass based shield 221. The wire mesh 315 protects the first glass based shield 221 from tampering, such as by a probe. In one embodiment, the wire mesh 315 is configured such that a probe attempting to penetrate the first glass based shield 221 will contact the wire mesh 315. Contact of the probe with the wire mesh 315 alters a bit stream transmitted through the active wire 320, and the altered bit stream is detectable by the detection module 310. The detection module 310 may be powered by any suitable power source 307 such as a coin cell or a super capacitor.

The detection module 310 generates a first serial bit stream to the output terminal 311. In one embodiment, the detection module 310 includes a physically unclonable function (PUF) 330 that feeds a linear feedback shift register (LFSR) 340, which generates the first serial bit stream. The first serial bit stream is transmitted through the output terminal 311 to the first end of the first wire portion 321. The first wire portion 321 sends the first serial bit stream across the first glass based shield 221. The first serial bit stream is transmitted from the first wire portion 321 to the wire mesh 315 and then to the second wire portion 322. In turn, the first serial bit stream is transmitted to the input terminal 312 of the detection module 310. In some embodiments, the first serial bit stream passes through an optional signal conditioner 342 before arriving at the comparator 345. The first serial bit stream is also sent to a delay 355 before reaching the comparator 345. One advantage of using the PUF is that the LFSR will be unique to each device. In this respect, an attack is not repeatable on another device if one of the devices is compromised.

The comparator 345 compares the first serial bit stream from the delay 355 with the first serial bit stream returning from the input terminal 312. When both first serial bit streams are identical, it's an indication the first serial bit stream was not altered as it passes through the first glass based shield 221. However, when a difference between the first serial bit streams is found upon comparison, it's an indication that the first serial bit stream was altered, such as by contact with the probe needle or other tampering. In response, the detection module 310 generates a tampering signal to indicate a security violation of the glass based shield 221. Additionally, when the wire mesh 315 is broken or manipulated, an attacker would have only one clock cycle to inject the tampering bit stream. The short time cycle increases the difficulty of injecting the tampering bit stream. Thus, the active shield system 350 allows monitoring against tampering and prevents tampering of the glass based shield 221.

Figure 6:
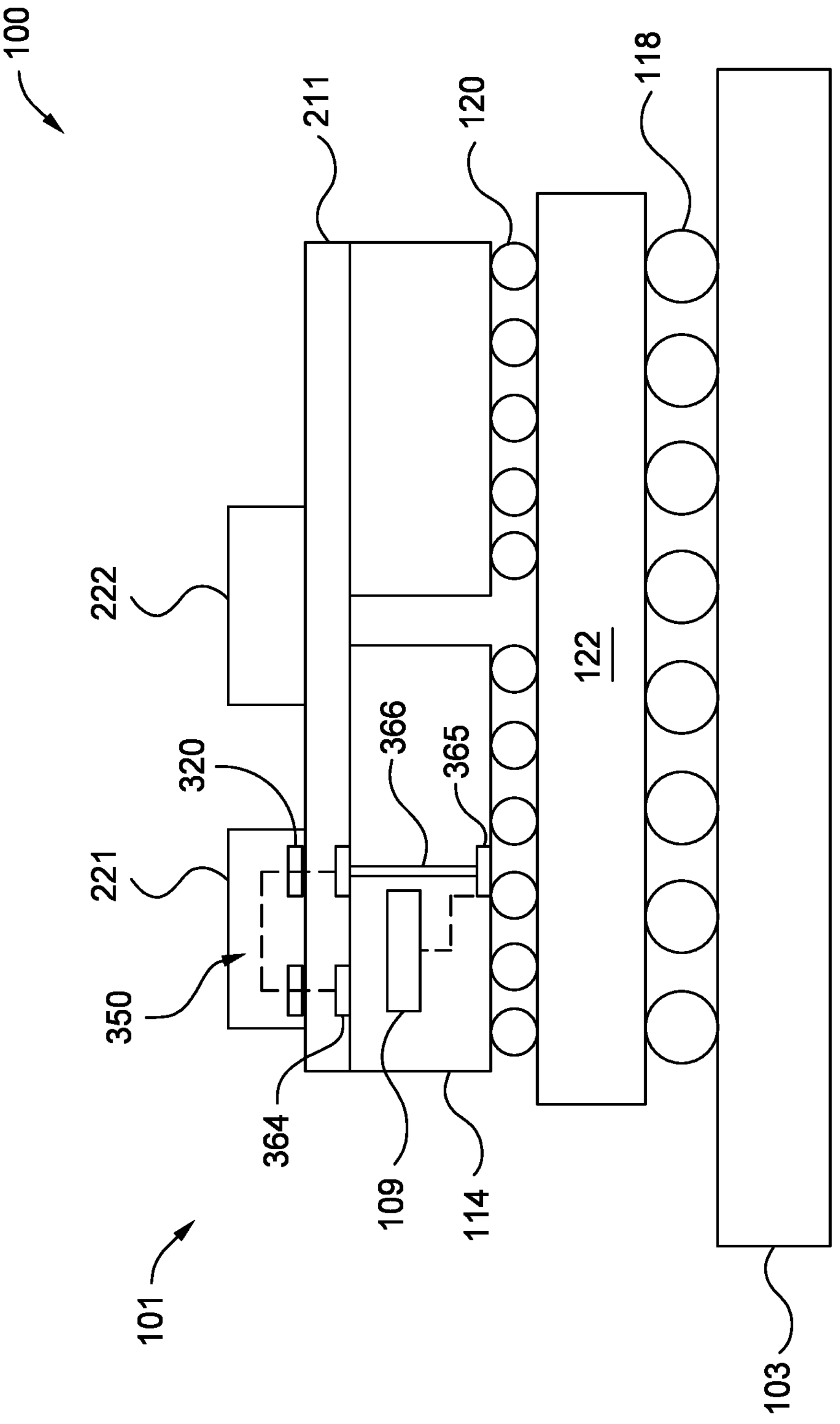
FIG. 6 is a front schematic view of an electronic device having an integrated chip package having an exemplary active shield.

FIG. 6 is a front schematic view of an electronic device 100 having an integrated chip package 101 having an exemplary active shield system 350. In this example, the security asset 109 is connected to a pad 365 in the IC die 114. The backside of the IC die includes a metal layer 364. A silicon via 366 connects the pad 365 to the metal layer 364. In turn, the metal layer 364 is connected to the active wire 320 of the active shield system 350.

Figure 5:
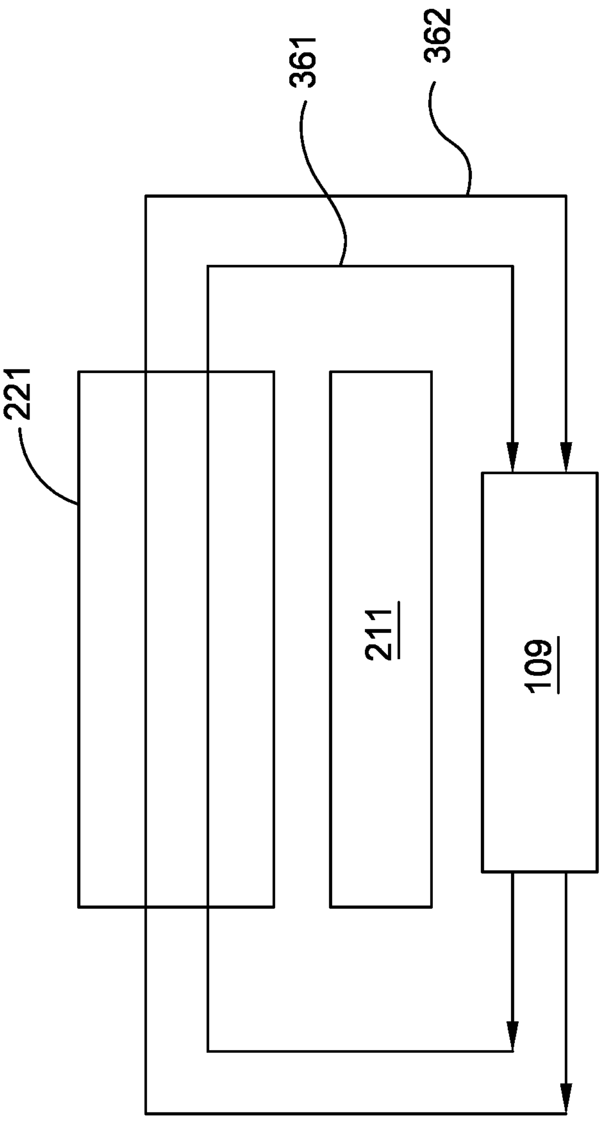
FIG. 5 illustrates another exemplary embodiment of an active shield for monitoring tampering of the glass based shield.

In another embodiment, the active shield system 350 may include first and second active wires 361, 362 for protecting the glass based shield 221, as shown in FIG. 5. The first and second active wires 361, 362 connect the outputs from the detection module 310 in the security asset 109 to the glass based shield 221. In turn, the active wires 361, 362 leaving the glass based shield 221 are connected to the inputs of the detection module 310. An optional oxide layer 211 is disposed between the glass based shield 221 and the detection module 310.

The first active wire 361 transmits a first serial bit stream to the glass based shield 221, and the second active wire 362 transmits a second serial bit stream to the glass based shield 221. A comparator 345 compares the first and second serial bit streams outputted to the glass based shield 221 to the first and second serial bit streams inputted to the detection module 310, respectively. When the outputted first and second serial bit streams are identical to the inputted first and second serial bit streams, it's an indication the first and second serial bit streams were not altered as they pass through the first glass based shield 221. However, when a difference is found in at least one of the first and second serial bit streams upon comparison, it's an indication that at least one of the first and second serial bit streams was altered, such as by contact with the probe needle or other tampering. In response, the detection module 310 generates a tampering signal to indicate a security violation of the glass based shield 221. In one embodiment, the second active wire 362 is arranged to run inverted to the first active wire 361. In this respect, when a probe needle having a diameter bigger than distance between the two active wires 361, 362 touch one of the wires 361, 362, a short will be created, thereby generating a tamper signal.

Figure 7:
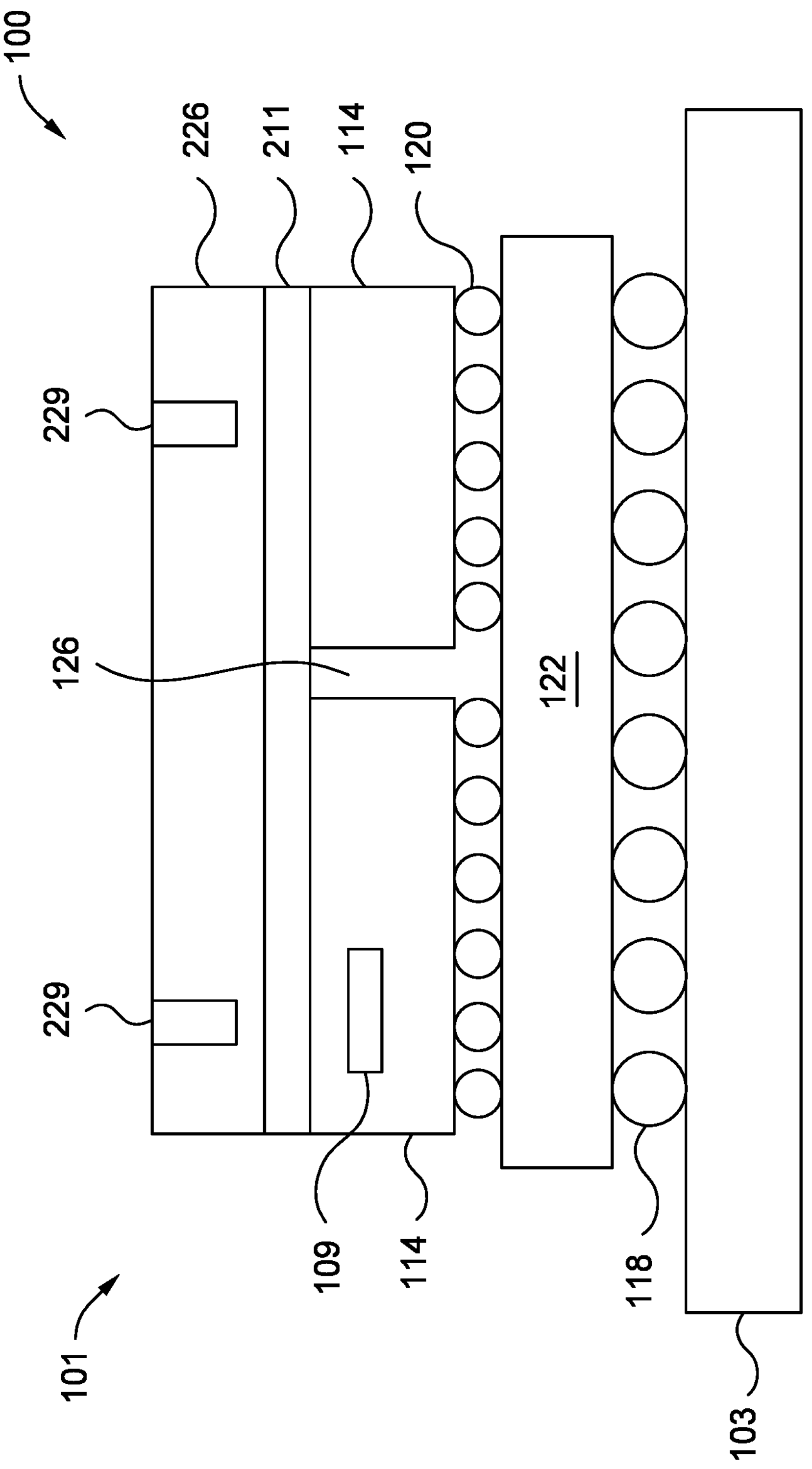
FIG. 7 is a front schematic view of another embodiment of an integrated chip package having an exemplary glass based shield.

FIG. 7 is a front schematic view of another embodiment of an exemplary glass based shield 226. In this example, the glass based shield 226 extends across the length of both dies 114. In this respect, the glass based shield 226 prevents tampering of the backside of both dies 114 and the gap 126 between the dies 114. In this example, the glass based shield 226 optionally includes one or more thermal vias 229 to facilitate heat transfer across the glass based shield 226. Although the thermal vias 229 are shown extending partially through the glass based shield 226, the thermal via 229 may also extend fully through the glass based shield 226. In one example, the thermal vias 229 may comprise a conductive metal such as copper. The chip package 101 may optionally include the oxide layer 211. In some embodiments, the chip package 101 may optionally include an active shield as described above.

Figure 8:
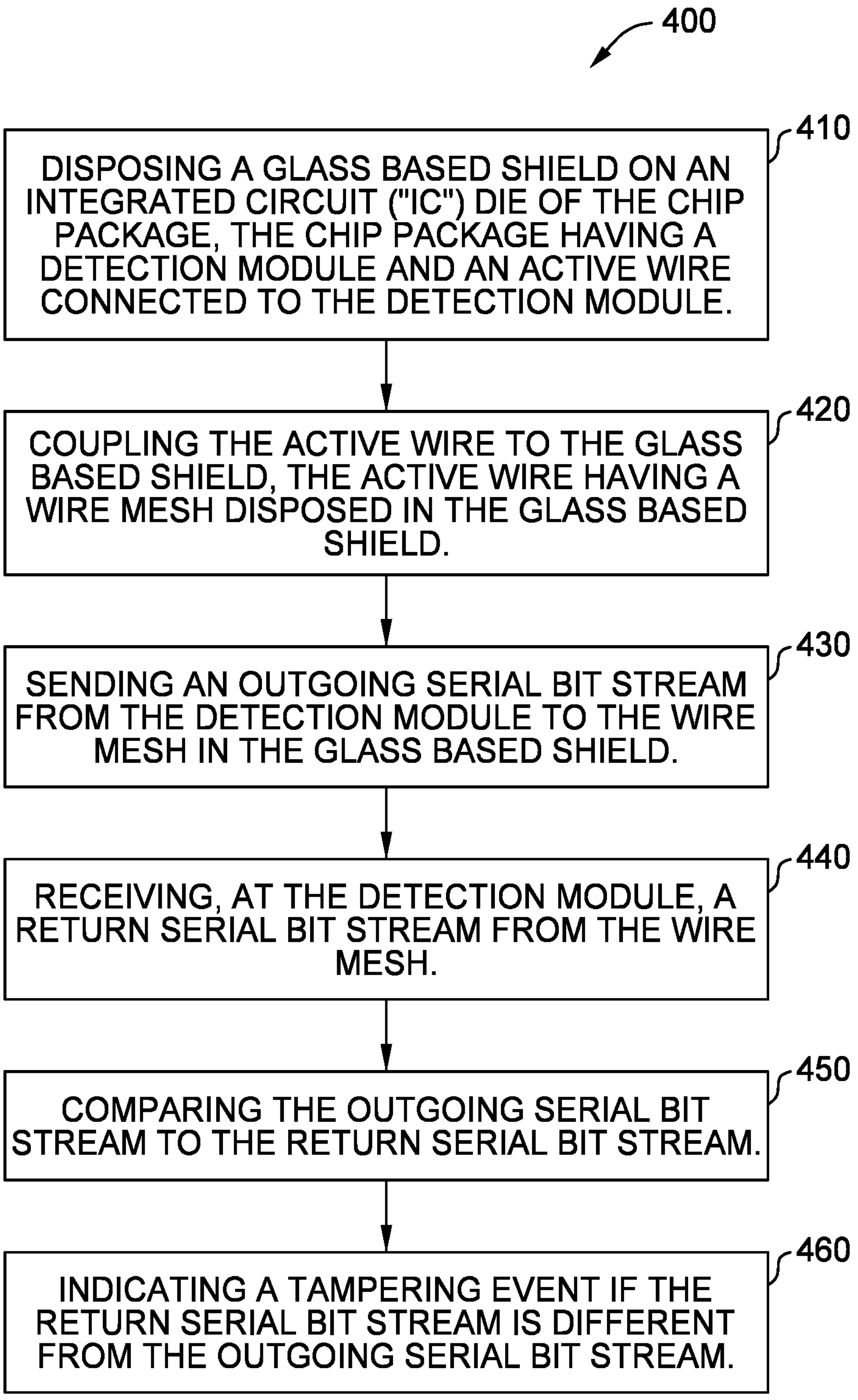
FIG. 8 is a flow diagram of a method for preventing tampering of a chip package.

Turning now to FIG. 8, a flow diagram of a method 400 for preventing tampering of a chip package is provided. The chip package may be configured as illustrated in FIG. 3, FIG. 6, or have another suitable configuration.

The method 400 begins at operation 410 by disposing a glass based shield 221 on an integrated circuit ("IC") die 114 of the chip package 100. The IC die 114 may be disposed on a package substrate 122 of the chip package 100. In one example, the glass based shield 221 is selectively disposed at locations where protection from tampering is needed. For example, the glass based shield 221 is disposed above the IC die 114 containing the security asset 109 to prevent backside attacks. In another example, the glass based shield 221 is at least partially disposed on top two adjacent IC dies 114. In one embodiment, the IC die 114 includes an active shield system 250 having a detection module 310 and an active wire 320 connected to the detection module 310.

At operation 420, the active wire 320 is coupled to the glass based shield 221. The active wire 320 includes a wire mesh 315 disposed in the glass based shield 221.

At operation 430, an outgoing serial bit stream is sent from the detection module 310 to the wire mesh 315 in the glass based shield 221. In one embodiment, the detection module 310 includes a physically unclonable function (PUF) 330 that feeds a linear feedback shift register (LFSR) 340, which generates the outgoing serial bit stream.

At operation 440, the detection module 310 receives a return serial bit stream from the wire mesh 315.

At operation 450, the outgoing serial bit stream is compared to the return serial bit stream. In one example, the comparator 345 is used to compare the outgoing serial bit stream to the return serial bit stream. When the outgoing serial bit stream is identical to the return serial bit stream, it's an indication the outgoing serial bit stream was not altered as it passes through the first glass based shield 221.

At operation 460, when the return serial bit stream is different than the outgoing serial bit stream, it's an indication that the outgoing serial bit stream was altered, such as by contact with the probe needle or other tampering. In response, the detection module 310 generates a tampering signal to indicate a tampering event has occurred with respect to the glass based shield 221.

In some embodiments, a chip package is provided with a passive shield for preventing tampering of a security asset in an IC die. In one embodiment, a glass based shield is selectively disposed on an integrated circuit (IC) die at a location above a security asset in the IC die. The glass based shield advantageously prevents access to the security asset via the IC die. In another embodiment, the passive shield includes an oxide layer disposed between the glass base shield and the IC die. The oxide layer acts as an insulator against electrical tampering of the IC die. The oxide layer may be used independently or in combination with the glass based shield.

In some embodiments, the chip package includes an active shield having a detection module and a wire connecting the detection module to the glass based shield. The detection module is configured to generate and send a serial bit stream to the glass based shield. The detection module is also configured to monitor for changes in the serial bit stream returning from the glass based shield. Changes detected in the serial bit stream indicates the glass based shield has been tampered. It is contemplated the active shield may be used independently or in combination with the passive shield.

In some embodiments, a chip package includes a package substrate and an integrated circuit (IC) die disposed on the package substrate. The IC dies includes a security asset. The chip package also includes a glass based shield selectively disposed on the IC die and above the security asset. The glass based shield is configured to block access to the security asset.

In some embodiments, the chip package includes an oxide layer disposed between the glass based shield and the IC die.

In some embodiments, the chip package includes a detection module and a wire connecting the detection module to the glass based shield. The detection module is configured to generate and send a serial bit stream to the glass based shield. The detection module is also configured to monitor for changes in the serial bit stream returning from the glass based shield. Changes detected in the serial bit stream indicates the glass based shield has been tampered.

In another example, a chip package includes a package substrate and an integrated circuit (IC) die disposed on the package substrate. A security asset is disposed in the IC die and includes a detection module for generating a serial bit stream. A glass based shield is selectively disposed on the IC die and above the security asset. The glass based shield prevents access to the security asset. The chip package also includes a wire for transmitting the serial bit stream to the glass based shield and a comparator for determining a change in the serial bit stream.

In another example, a method of preventing tampering of a chip package includes disposing a glass based shield on an integrated circuit ("IC") die of the chip package. The chip package has a detection module and an active wire connected to the detection module. The method also includes coupling the active wire to the glass based shield. The active wire has a wire mesh disposed in the glass based shield. The method further includes sending an outgoing serial bit stream from the detection module to the wire mesh in the glass based shield. The detection module receives a return serial bit stream from the wire mesh. The outgoing serial bit stream is compared to the return serial bit stream. A tampering event is indicated if the return serial bit stream is different from the outgoing serial bit stream.

While the foregoing is directed to embodiments of the present invention, other and further embodiments of the invention may be devised without departing from the basic scope thereof, and the scope thereof is determined by the claims that follow.

What is claimed is:

1. A chip package comprising:
- a package substrate;
- an integrated circuit (IC) die disposed on the package substrate;
- a security asset disposed in the IC die; and
- a glass based shield selectively disposed on the IC die and above the security asset, the glass based shield blocking access to the security asset.

2. The chip package of claim 1, further comprising an oxide layer disposed between the glass based shield and the IC die.

3. The chip package of claim 1, further comprising an active shield for monitoring tampering of the glass based shield, the active shield having:
- a detection module for generating a serial bit stream;
- a wire for transmitting the serial bit stream to the glass based shield.

4. The chip package of claim 3, wherein the detection module includes a physically unclonable function and a linear feedback shift register for generating the serial bit stream.

5. The chip package of claim 3, further comprising a comparator for comparing the serial bit stream transmitted to the glass based shield to the serial bit stream returning from the glass based shield.

6. The chip package of claim 3, further comprising an oxide layer disposed between the glass based shield and the IC die.

7. The chip package of claim 3, wherein the detection module is disposed in the security asset.

8. The chip package of claim 1, wherein the IC die is a first IC die, and further comprising:
- a second IC die disposed on the package substrate; and
- a second glass based shield at least partially disposed on the first IC die and the second IC die.

9. The chip package of claim 8, wherein the glass based shield is a first glass based shield, and further comprising a silicon carrier disposed between the first glass based shield and the second glass based shield.

10. A chip package, comprising:

a package substrate;

an integrated circuit (IC) die disposed on the package substrate;

a security asset disposed in the IC die and having a detection module for generating a serial bit stream;

a glass based shield selectively disposed on the IC die and above the security asset, the glass based shield blocking access to the security asset;

a wire for transmitting the serial bit stream to the glass based shield; and a comparator for determining a change in the serial bit stream.

11. The chip package of claim 10, further comprising an oxide layer disposed between the glass based shield and the IC die.

12. The chip package of claim 10, wherein the detection module includes a physically unclonable function and a linear feedback shift register for generating the serial bit stream.

13. The chip package of claim 10, wherein the wire is a first wire and the chip package further comprises a second wire, and wherein the second wire is arranged to run inverted relative to the first wire.

14. The chip package of claim 10, wherein the IC die is a first IC die, and further comprising:

a second IC die disposed on the package substrate; and a second glass based shield at least partially disposed on the first IC die and the second IC die.

15. The chip package of claim 14, further comprising an oxide layer disposed above the first and second glass based shields.

16. A method of preventing tampering of a chip package, comprising:

sending an outgoing serial bit stream from a detection module of a chip package having an active wired connected to the detection module to a wire mesh disposed in a glass based shield, the glass based shield disposed on a first integrated circuit ("IC") of the chip package;

receiving, at the detection module, a return serial bit stream from the wire mesh;

comparing the outgoing serial bit stream to the return serial bit stream; and indicating a tampering event if the return serial bit stream is different from the outgoing serial bit stream.

17. The method of claim 16, further comprising disposing an oxide layer between the glass based shield and the first IC die.

18. The method of claim 16, wherein the outgoing serial bit stream is generated by a physically unclonable function and a linear feedback shift register in the detection module.

19. The method of claim 16, wherein the first IC die includes a security asset, and the detection module is disposed in the security asset.

20. The method of claim 16, wherein the chip package includes a second IC die disposed on a package substrate, and the method further comprises:

disposing a second glass based shield at least partially on the first IC die and the second IC die.

* * * * *